United States Patent [19]

Vaartstra

[11] Patent Number: 5,635,022

[45] Date of Patent: Jun. 3, 1997

[54] SILICON OXIDE REMOVAL IN SEMICONDUCTOR PROCESSING

[75] Inventor: Brian A. Vaartstra, Nampa, Id.

[73] Assignee: Micron Technology, Inc., Boise, Id.

[21] Appl. No.: 595,978

[22] Filed: Feb. 6, 1996

[51] Int. Cl.$^6$ .............................. H01L 21/00; C09K 13/06
[52] U.S. Cl. ........................... 438/723; 216/88; 216/79; 252/79.4; 438/743; 438/697
[58] Field of Search .......................... 156/657.1, 653.1, 156/646.1; 252/79.1, 79.4

[56] References Cited

U.S. PATENT DOCUMENTS 4,582,624  4/1986  Enjo et al. ............................ 252/79.4

FOREIGN PATENT DOCUMENTS 7-193054  7/1995  Japan ....................... H01L 21/3065

OTHER PUBLICATIONS

Ono et al., "Direct Transformation of Silica into Alkoxysilanes by Gas–Solid Reactions", *J. Chem. Soc. Chem. Commun.*, No. 2, pp. 136–137, (1992).

Rosenheim et al., "Zeitschrift für anorganische und allgemeine Chemie", *Z. Anorg. Allg. Chem.*, Band 196, pp. 160–176, (1931).

Boudin et al., "Reactivity of Dianionic Hexacoordinated Silicon Complexes toward Nucleophiles: A New Route to Organosilanes from Silica", *Organometallics*, 7, pp. 1165–1171, (1988).

Boudin et al., "Reactivity of hypervalent silicon derivatives. One step synthesis of mono—and di–hydrogenosilanes", *j. Organomet. Chem.*, 362, pp. 265–272, (1989).

Wolf et al., "Silicon Processing for the VLSI Era.", vol. 1, Copyright (1986), Table of Contents pp. xi–xx.

*Primary Examiner*—R. Bruce Breneman
*Assistant Examiner*—Michael E. Adjodha
*Attorney, Agent, or Firm*—Mueting, Raasch, Gebhardt & Schwappach, P.A.

[57] ABSTRACT

The present invention provides methods of removing or etching silicon oxide from a semiconductor wafer by contacting the silicon oxide with diorganocarbonates, including comprising hydrocarbyl groups that are either aliphatic, aromatic, or a combination thereof. The diorganocarbonate can include ($C_1$–$C_{10}$)hydrocarbyl groups. Specific examples of useful diorganocarbonates include dimethylcarbonate, diethylcarbonate, dipropylcarbonate, diisopropylcarbonate, and dibutylcarbonate.

30 Claims, 1 Drawing Sheet

5,635,022

SILICON OXIDE REMOVAL IN SEMICONDUCTOR PROCESSING

FIELD OF THE INVENTION

The present invention relates to the field of semiconductor processing. More particularly, the present invention provides methods of removing silicon oxides in semiconductor processing using diorganocarbonates.

BACKGROUND OF THE INVENTION

In semiconductor manufacturing, silicon oxides are removed to form, for example, holes where diffusions are to be made or to allow for the deposition of interconnect materials. In other applications, holes or grooves are provided for trench capacitors.

As used in connection with the present invention, the term "silicon oxides" includes silicon dioxide (whether formed through Thermal oxidation or CVD processes), polysilicon, and doped polysilicon or other silicon oxides. One example of a doped silicon oxide is boronphosphosilicate glass (BPSG).

Current processes for etching silicon oxides typically involve The use of hydrofluoric acids (HF) or buffered HF (typically buffered with, for example, ammonium fluoride). The advantage of using HF-based wet etches in semiconductor processing is that pure silicon, which typically forms the substrate on which The silicon oxides are found, etches at a very low rate with respect to the rates at which silicon oxides etch. As a result, the underlying silicon or, in some cases, gallium arsenide (GaAs), can serve as an etch stop to control the depth of etching on the semiconductor wafer.

In addition, etches using hydrofluoric acid can be used with pure silicon oxides or with doped silicon oxides, although etch rates may vary depending on the type and concentrations of the dopant or dopants. Although HF-based wet etching offers advantages, it also suffers from a number of disadvantages. The acids can produce severe burns if they come into direct contact with skin. Furthermore, fumes from the hydrofluoric acid can also produce skin irritation and/or eye damage in operators. Furthermore, other acids are often used in combination with HF including $HNO_3$, $H_2SO_4$, and others. All of these acids can cause severe burns and/or eye damage.

A further disadvantage of known wet etching processes is that they can involve the production of halides, further complicating the safety concerns during etching.

Because of the potentially dangerous nature of acids used in wet etching, expensive systems must be used to control the acids and any fumes that result from their use. This, of course, adds to the cost of semiconductor processing.

One alternative to the use of HF for etching silicon oxides is to use a hot alkaline base. Examples of two bases useful for etching silicon oxides include sodium hydroxide and potassium hydroxide. Drawbacks to using hot alkaline bases for etching are that they also etch pure silicon and gallium arsenide and they attack the organic masking materials used in many semiconductor manufacturing processes. Furthermore, many of the personnel safety concerns present when dealing with HF-based wet etching are also present when using strong bases for etching silicon oxides.

Another disadvantage for both HF-based etching and alkaline base etching is that the semiconductor wafers must be thoroughly cleaned after either process to prevent contamination of the wafer. Contamination can, of course, increase defects and waste.

Yet another process that involves removing silicon oxide from semiconductor wafers is Chemical Mechanical Polishing (CMP) (also referred to as Chemical Mechanical Planarization) which is used to planarize semiconductor wafers before further processing or to provide a layer having a known thickness. Planarization of wafers smooths the surface of the wafer to allow for more uniform layers to be formed above the layer being planarized. CMP is useful with silicon oxides formed by any process.

In general, CMP involves holding or rotating a wafer of semiconductor material against a wetted polishing surface under controlled chemical slurry, pressure and temperature conditions. The chemical slurry may contain abrasive agents and/or chemical etchants. The chemical etchants can include bases and catechols as a complexing agent to chemically remove silicon oxides.

Disadvantages of known CMP processes include that the bases used to chemically etch the silicon oxides pose the safety concerns discussed above. Furthermore, the bases and any abrasive agents also pose contamination problems if the wafer surface is not thoroughly cleaned after the CMP process is finished.

SUMMARY OF THE INVENTION

The present invention provides methods of removing silicon oxide from semiconductor wafers by contacting the silicon oxide with diorganocarbonate.

In one aspect, the method according to the present invention, comprises etching specific geometries into silicon oxide on a semiconductor wafer by contacting the silicon oxide with a diorganocarbonate comprising hydrocarbyl groups that are either aliphatic, aromatic, or a combination thereof.

In another aspect, the method according to the present invention, comprises etching specific geometries into silicon oxide on a semiconductor wafer by contacting the silicon oxide with a diorganocarbonate comprising ($C_1$–$C_{10}$) hydrocarbyl groups, either aliphatic, aromatic, or a combination thereof.

In another aspect, the method according to the present invention according to the present invention comprises etching specific geometries into silicon oxide on a semiconductor wafer by contacting the silicon oxide with a diorganocarbonate comprising di($C_1$–$C_{10}$)alkylcarbonates, including dimethylcarbonate, diethylcarbonate, dipropylcarbonate, diisopropylcarbonate, and dibutylcarbonate.

In another aspect, the method according to the present invention comprises planarizing a layer of silicon oxide on a semiconductor wafer using a slurry containing a diorganocarbonate.

In another aspect, the method according to the present invention comprises planarizing a layer of silicon oxide on a semiconductor wafer using a slurry containing a diorganocarbonate comprising hydrocarbyl groups that are either aliphatic, aromatic, or a combination thereof.

In yet another aspect, the method according to the present invention comprises planarizing a layer of silicon oxide on a semiconductor wafer using a slurry containing a diorganocarbonate in which the hydrocarbyl groups comprise ($C_1$–$C_{10}$)hydrocarbyl groups, either aliphatic, aromatic, or a combination thereof.

In still another aspect, the method according to the present invention comprises planarizing a layer of silicon oxide on a semiconductor wafer using a slurry containing a di($C_1$–$C_{10}$)alkylcarbonate, including dimethylcarbonate, diethylcarbonate, dipropylcarbonate, diisopropylcarbonate, and dibutylcarbonate.

Advantages of the present invention include the ability to etch silicon oxides in the absence of HF to reduce the risks associated with using HF.

Another advantage of using diorganocarbonates to remove silicon oxides is that they may be applied in vapor-phased processing to further simplify and improve the removal of silicon oxides from semiconductor wafers. The diorganocarbonates may also be useful in an anisotropic etching process.

Still another advantage of using diorganocarbonates over HF-based etchants in silicon oxide removal is that the diorganocarbonates may improve the removal of silicon oxides doped with metallic impurities which may otherwise hinder processing using HF-based wet etches.

These and other features and advantages of methods according to the present invention are set forth below in the detailed description of the invention.

DETAILED DESCRIPTION OF THE INVENTION

As used in semiconductor manufacturing processes according to the present invention,. diorganocarbonate is provided in either solution or vapor phase and contacted with a silicon oxide layer on a semiconductor wafer to remove all or some of the silicon oxide from the semiconductor wafer.

Figure 1:
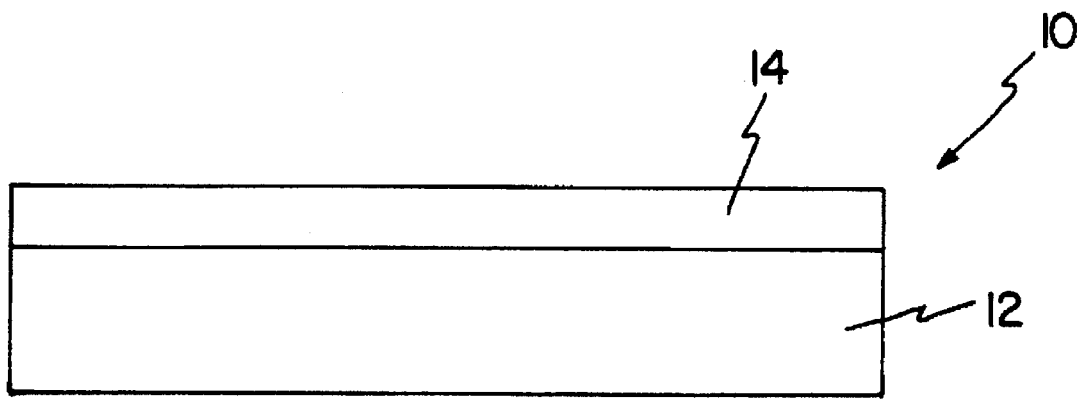
FIG. 1 is a schematic cross-sectional diagram of a semiconductor wafer with a base of silicon and a layer of silicon oxide deposited thereon.
Figure 2:
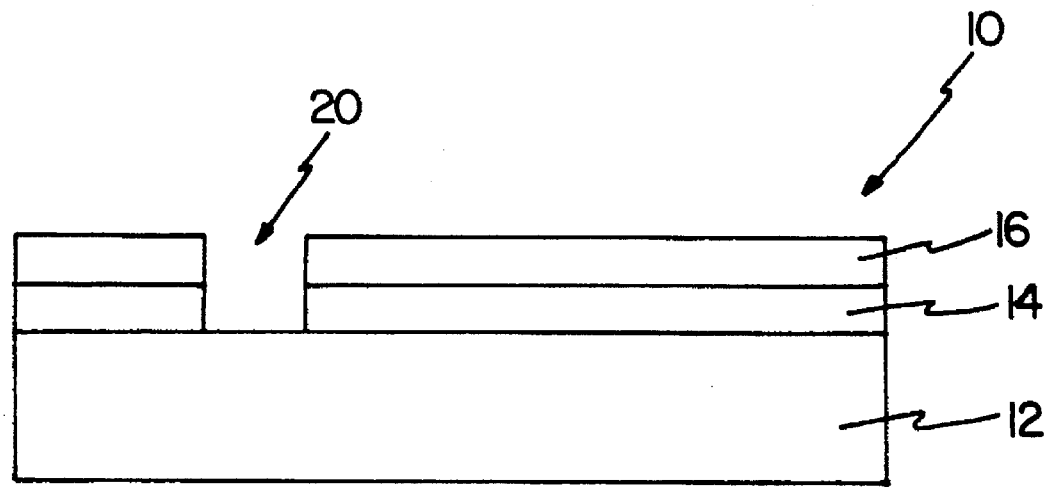
FIG. 2 is a schematic diagram of the wafer of FIG. 1 including a layer of masking material and an opening formed in both the masking material and the silicon oxide layer.

FIGS. 1 and 2 illustrate one method according to the present invention in which semiconductor wafers can be processed using diorganocarbonate to remove silicon oxide. FIG. 1 is a schematic cross-sectional diagram of a semiconductor wafer 10 which includes a base 12 of silicon on which a silicon oxide layer 14 has been formed. As will be understood by those skilled in the art, the silicon oxide layer 14 can be deposited in, for example, a CVD process, or it can be formed through thermal oxidation.

In any event, the silicon oxide layer 14 is typically used as a nonconductive barrier to allow for interconnection between various areas on the underlying base 12, as well as to provide definition for electrical components such as resistors, capacitors, etc. above the surface of the base wafer 12.

FIG. 2 shows the results of an etching process according to the present invention. A layer of masking material 16, was applied over the layer 14 of silicon oxide, and a pattern including the opening 20 shown in FIG. 2 was formed in the masking material 16. After the pattern was formed in the masking material 16, the silicon oxide etching process using diorganocarbonate according to the present invention was applied in a suitable manner to remove the silicon oxide 14 exposed by the opening 20 in the masking material 16.

As a result, the underlying silicon base 12 is exposed in the area defined by opening 20. After the opening 20 is extended through the silicon oxide layer 14, the wafer 10 can be processed as desired.

Although not depicted, an alternative to processes in which the silicon oxide layer 14 is completely removed to expose the underlying silicon base 12, it may be desirable to remove only a portion of the silicon oxide 14, i.e., to a controlled depth. Such a process would be designed based on the etch rate of the specific silicon oxide and diorganocarbonate used, as well as the conditions (i.e. temperature, pressure, etc.) under which the process was conducted In addition to the use of diorganocarbonate for removing silicon oxide to provide openings in or remove portions of a layer of silicon oxide, the present invention also is useful in cleaning silicon wafers which have a layer of native silicon oxide formed on them, The native silicon oxide may be formed between processing steps due to exposure of the wafer to air, or as a result of other processes performed after the silicon base has been exposed. In many instances, the native oxide layer must be removed before the opening 20 is filled with a metal or other barrier layer to improve adhesion or conduction between the silicon base and the material deposited on it.

A vapor-phase etching process using diorganocarbonates according to the present invention could comprise vaporizing the diorganocarbonate into a zone of the required temperature and pressure to vaporize the compound and carrying the vapor into a chamber containing the semiconductor wafers. The chamber would preferably be heated to the temperatures at which desirable silicon oxide etch rates could be achieved. Alternatively, the diorganocarbonate could also be heated in a vessel to form a vapor which could then be transported by pressure transfer or under the flow of a suitable carrier gas to the chamber containing the semiconductor process wafer.

If the diorganocarbonate is used in a wet bath, it could be provided as a neat liquid or mixed with a solvent or a chemical solution. The solution could contain other catalysts (some of which are described below), surfactants, or other etchants to produce a desired etch rate when the semiconductor wafer is placed in the bath.

In addition to etching holes and removing native silicon oxide layers from semiconductor wafers, diorganocarbonate can also be used to planarize the surface of silicon oxide layers on a semiconductor wafer. One process for planarizing a semiconductor wafer that could be used with a diorganocarbonate is Chemical Mechanical Polishing (CMP) in which the diorganocarbonate is added to the slurry or mixture where it enhances the rate of silicon oxide removal. As a result, the rate of silicon oxide removal is increased which reduces the time needed to planarize the silicon oxide layer.

In one specific application, CMP employing diorganocarbonate, preferably a dialkylcarbonate, can be used to planarize a layer of boronphosphosilicate glass during one of the steps in fabrication of a semiconductor wafer used for a memory chip.

As used in connection with the present invention, diorganocarbonates useful for removing silicon oxide on a semiconductor wafer can be represented as (R)OC(O)O(R') wherein the R and R' groups are chosen such that the diorganocarbonate reacts with the silicon oxide to produce organosilanes ($Si(OR)_4$) that are either: a) volatile under conditions of process for vapor-phase processing, or b) soluble for wet processes. Each of the R groups may be the same or different hydrocarbyl groups.

The organic groups represented by R can be a mono- or multivalent organic group, preferably containing 1–30 carbon atoms, more preferably containing 1–20 carbon atoms, and even more preferably 1–10 carbon atoms. These groups can include aliphatic groups, aromatic groups, or mixtures thereof (i.e., alkaryl and aralkyl groups) having nonperoxidic oxygen, nitrogen, or sulfur atoms, as well as carbonyl moieties in the chain. In the context of the present invention, the term "aliphatic group" means a saturated or unsaturated linear, branched, or cyclic hydrocarbon group. This term is used to encompass cyclic as well as acyclic groups, optionally including heteroatoms such as oxygen, nitrogen, and sulfur. It is also used to encompass alkyl, alkoxy, alkenyl, and vinyl groups, for example. The term "alkyl group" means a saturated linear, branched, or cyclic hydrocarbon group including, for example, methyl, ethyl, t-butyl, isopropyl, heptyl, dodecyl, octadecyl, amyl, 2-ethylhexyl, and the like. The term "alkoxy group" means an alkyl group attached to a molecule by oxygen. The terms "aromatic group" or "aryl group" means a mono- or polynuclear aromatic hydrocarbon group, optionally including heteroatoms such as oxygen, nitrogen, and sulfur.

As is well understood in this technical area, a large degree of substitution is not only tolerated, but is often advisable. Substitution is anticipated on the organic compounds of the present invention. As a means of simplifying the discussion and recitation of certain terminology used through out this application, the terms "group" and "moiety" are used to differentiate between chemical species that allow for substitution or that may be substituted and those that do not so allow or may not be substituted. Thus, when the term "group" is used to describe a chemical substituent, the described chemical material includes the unsubstituted group and that group with conventional substitution. Where the term "moiety" is used to describe a chemical compound or substituent, only an unsubstituted chemical material is to be included. For example, the phrase "alkyl group" is intended to include not only pure open-chain and cyclic saturated hydrocarbon alkyl substituents, such as methyl, ethyl, propyl, t-butyl, cyclohexyl, adamantyl, octadecyl, and the like, but also alkyl substituent bearing further substituents known in the art, such as hydroxy, alkoxy, aryloxy, arylsulfonyl, alkylsulfonyl, vinyl, phenyl, halogen, atoms (F, Cl, Br, and I), cyano, carbamoyl, nitro, amino, carboxyl, etc. Thus, "alkyl group" includes ether groups (e.g., $CH_3$—$CH_2$—$CH_2$—O—$CH_2$—), haloalkyls, nitroalkyls, carboxyalkyls, hydroxyalkyls, sulfoalkyls, etc. On the other hand the phrase "alkyl moiety" is limited to the inclusion of only pure open-chain and cyclic saturated hydrocarbon alkyl substituents, such as methyl, ethyl, propyl, t-butyl, cyclohexyl, adamantyl, octadecyl, and the like.

Preferably, the R groups on the diorganocarbonates used in connection with the methods according to the present invention comprise $(C_1-C_{10})$hydrocarbyl groups, either aliphatic, aromatic, or a combination thereof.

More preferably, the diorganocarbonates useful in methods according to the present invention are di($C_1-C_{10}$) alkylcarbonates, including dimethylcarbonate, diethylcarbonate, dipropylcarbonate, diisopropylcarbonate, and dibutylcarbonate. The dialklcarbonate is a source of alkoxide and an alkylating agent which produces alkoxysilane by reacting with silicon oxide on the semiconductor wafer. The following equation illustrates the reaction:

$$SiO_2 + 2(CH_3)OC(O)O(CH_3) \rightarrow Si(OCH_3)_4 + 2CO_2$$

In addition to contacting the silicon oxide with diorganocarbonate to remove it from the semiconductor wafer, the process may be improved by the use of base catalysis in which the surface is pretreated with a catalyst. The base catalyst may speed the reactions between the dialkylcarbonates and the silicon oxides. Although the addition of a base to the processing of semiconductor wafers according to the present invention may raise some of the concerns associated with etching using bases, the amount of base catalyst needed is far less than the amounts used when the base is provided as the etchant to remove the silicon oxide.

Examples of suitable base catalysts include alkali hydroxides, alkali metal carbonates, ammonia, simples amines (e.g., $NR_3$), alkaline earth metal hydroxides, and alkaline earth metal carbonates. More specific examples of some suitable bases include KOH, NaOH, $NH_4OH$, $NR_4OH$ (wherein R is a hydrocarbyl group having 1–10 carbon atoms, more preferably 1–4 carbon atoms), $KCO_3$, and others.

The catalyst may be provided on the surface of the silicon oxide before the diorganocarbonate is presented or it may be premixed with the solution or vapor containing the diorganocarbonate and contacted with the silicon oxide surface simultaneously.

As an alternative to the use of a base to catalyze the reaction between the diorganocarbonate and silicon oxide, a plasma containing hydrogen or organic radicals can be provided in conjunction with the vapor-phase diorganocarbonate to catalyze the reaction.

It may be particularly advantageous to operate the process under conditions in which the diorganocarbonate and the byproducts of the reaction with silicon oxides are volatile. If the diorganocarbonate and byproducts are volatile, the wafer can be free of any particulates or contaminants after the etching process is completed without the need for additional cleaning before further processing. This is not true in an HF-based wet etching process in which the wafer must be thoroughly cleaned after the etching process to prevent contamination during later processing steps.

The following nonlimiting examples are provided to illustrate methods according to the present invention:

EXAMPLE 1

In a process for wet-etching silicon oxide on a semiconductor wafer using diorganocarbonates, a layer of photoresist is patterned over a layer of $SiO_2$ to expose desired areas of the $SiO_2$. The patterned semiconductor wafer is placed in an ultrasonic bath of diethylcarbonate having 1% by weight of KOH. Ultrasonic energy is provided until a desired thickness of $SiO_2$ is etched, after which the semiconductor wafer is removed from the bath and rinsed in deionized water.

EXAMPLE 2

In a process for vapor-etching silicon oxide on a semiconductor wafer using diorganocarbonates, a layer of photoresist is patterned over a layer of $SiO_2$ to expose desired areas of the $SiO_2$. The patterned semiconductor wafer is placed in a low-pressure CVD chamber having a platen heated to a temperature of about 250° C. A stainless steel bubbler containing dimethylcarbonate is used to deliver dimethylcarbonate vapor to the CVD chamber using He carrier gas flowing at about 10 sccm. Etchant flow is continued until the desired thickness of $SiO_2$ is removed.

EXAMPLE 3

In a method of planarizing the surface of a semiconductor wafer, a wafer having a 14,000 Å thick layer of boronphosphosilicate glass deposited over a microchip structure is mounted on a Chemical Mechanical Polishing tool. The pad is wetted with a slurry containing about 9% alumina (0.3 μm nominal particle size) and 1% KOH in diethylcarbonate. A pressure of 2 pounds per square inch (96 Pascals) is applied between the pad and the wafer and planarization is carried out at a pad velocity of 100 revolutions per minute and a sample velocity of 40 revolutions per minute.

Although specific methods and examples have been illustrated and described herein, it will be appreciated by those of ordinary skill in the art that any arrangement that is calculated to achieve the same purpose may be substituted for the specific methods and examples described. This application is intended to cover any adaptations or variations of the present invention. Therefore, it is manifestly intended that this invention be limited only by the claims and the equivalents thereof.

What is claimed is:

1. A method of removing silicon oxide from the surface of a semiconductor wafer comprising the steps of:
   a) providing a semiconductor wafer having silicon oxide located on a surface thereof; and
   b) planarizing at least a portion of the silicon oxide on the semiconductor wafer by contacting the silicon oxide with diorganocarbonate.

2. A method according to claim 1, wherein the diorganocarbonate is provided in liquid phase.

3. A method according to claim 1, wherein the diorganocarbonate is provided in vapor phase.

4. A method according to claim 1, wherein the diorganocarbonate is selected from the group consisting of dimethylcarbonate, diethylcarbonate, dipropylcarbonate, diisopropylcarbonate, dibutylcarbonate, and mixtures thereof.

5. A method according to claim 1, wherein the diorganocarbonate can be represented as (R)OC(O)O(R'), and further wherein the R and R' groups comprise ($C_1$–$C_{10}$)hydrocarbyl groups selected from the group consisting of aliphatic, aromatic, and a combination thereof.

6. A method of removing silicon oxide from the surface of a semiconductor wafer comprising the steps of:
   providing a semiconductor wafer having silicon oxide located on a surface thereof;
   b) providing a catalyst; and
   c) planarizing the semiconductor wafer by contacting the silicon oxide with diorganocarbonate and the catalyst, wherein the diorganocarbonate can be represented as (R)OC(O)O(R), wherein the R groups are hydrocarbyl groups selected from the group consisting of an aliphatic group, an aromatic group, and a combination thereof.

7. A method according to claim 6, wherein the step of removing silicon oxide further comprises etching a desired geometry into the silicon oxide located on the semiconductor wafer.

8. A method according to claim 6, wherein the step of removing silicon oxide further comprises planarizing the silicon oxide located on the semiconductor wafer.

9. A method according to claim 6, wherein the catalyst contacts the silicon oxide substantially simultaneously with the diorganocarbonate.

10. A method according to claim 6, wherein the catalyst comprises a base.

11. A method according to claim 6, wherein the catalyst comprises a plasma containing hydrogen or organic radicals.

12. A method according to claim 6, wherein the diorganocarbonate is provided in vapor phase.

13. A method according to claim 6, wherein the catalyst is provided in vapor phase.

14. A method of removing silicon oxide from the surface of a semiconductor wafer comprising the steps of:
   a) providing a semiconductor wafer having silicon oxide located on a surface thereof; and
   b) planarizing the semiconductor wafer by contacting the silicon oxide with diorganocarbonate and a catalyst.

15. A method according to claim 14, wherein the catalyst contacts the silicon oxide substantially simultaneously with the diorganocarbonate.

16. A method according to claim 14, wherein the catalyst comprises a base.

17. A method according to claim 14, wherein the catalyst comprises a plasma containing hydrogen or organic radicals.

18. A method according to claim 14, wherein the diorganocarbonate is provided in vapor phase.

19. A method according to claim 14, wherein the catalyst is provided in vapor phase.

20. A method of removing silicon oxide from the surface of a semiconductor wafer comprising the steps of:
   a) providing a semiconductor wafer having silicon oxide located on a surface thereof;
   b) providing a plasma catalyst; and
   c) removing at least a portion of the silicon oxide by contacting the silicon oxide with diorganocarbonate and the plasma catalyst.

21. A method according to claim 20, wherein the diorganocarbonate is provided in vapor phase.

22. A method according to claim 20, wherein the step of removing silicon oxide further comprises etching a desired geometry into the silicon oxide located on the semiconductor wafer.

23. A method according to claim 20, wherein the step of removing silicon oxide further comprises planarizing the silicon oxide located on the semiconductor wafer.

24. A method according to claim 20, wherein the plasma catalyst comprises hydrogen or organic radicals.

25. A method of removing silicon oxide from the surface of a semiconductor wafer comprising the steps of:
   a) providing a semiconductor wafer having silicon oxide located on a surface thereof; and
   b) removing at least a portion of the silicon oxide by contacting the silicon oxide with a liquid diorganocarbonate.

26. A method according to claim 25, wherein the step of removing silicon oxide further comprises etching a desired geometry into the silicon oxide located on the semiconductor wafer.

27. A method according to claim 25, wherein the step of removing silicon oxide further comprises planarizing the silicon oxide located on the semiconductor wafer.

28. A method according to claim 25, further comprising a step of providing a catalyst.

29. A method according to claim 28, wherein the catalyst comprises a plasma containing hydrogen or organic radicals.

30. A method according to claim 25, wherein the diorganocarbonate can be represented as (R)OC(O)O(R), and further wherein the R groups are ($C_1$–$C_{10}$)hydrocarbyl groups selected from the group consisting of an aliphatic group, an aromatic group, and a combination thereof.

* * * * *

UNITED STATES PATENT AND TRADEMARK OFFICE
CERTIFICATE OF CORRECTION

PATENT NO.: 5,635,022
DATED: June 3, 1997
INVENTOR(S): Brian A. Vaartstra

It is certified that error appears in the above-identified patent and that said Letters Patent is hereby corrected as shown below:

Column 1, line 19, delete "through Thermal" and insert --through thermal--;

Column 1, line 24, delete "involve The" and insert --involve the--;

Column 1, line 28, delete "which The" and insert --which the--;

Column 1, line 28, delete "arc found" and insert --are found--;

Column 3, line 34, delete "invention,," and insert --invention,--;

Column 6, line 14, delete "KC0$_3$" and insert --KCO$_3$--; and

Column 7, line 41, delete "providing" and insert --a) providing--.

Signed and Sealed this

Eighteenth Day of May, 1999

*Attest:*

Q. TODD DICKINSON

*Attesting Officer*   Acting Commissioner of Patents and Trademarks